(12) United States Patent
Tsai et al.

(10) Patent No.: US 12,355,467 B2
(45) Date of Patent: Jul. 8, 2025

(54) COMPLEMENTARY CURRENT-STEERING DIGITAL-TO-ANALOG CONVERTER

(71) Applicant: MEDIATEK INC., Hsinchu (TW)

(72) Inventors: Chih-Hou Tsai, Hsinchu (TW); Chien-Yuan Cheng, Hsinchu (TW); Ting-Yu Ko, Hsinchu (TW); Shu-Lin Chang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 226 days.

(21) Appl. No.: 18/325,035

(22) Filed: May 29, 2023

(65) Prior Publication Data
US 2024/0048149 A1 Feb. 8, 2024

Related U.S. Application Data (60) Provisional application No. 63/370,398, filed on Aug. 4, 2022.

(51) Int. Cl.
*H03M 1/74* (2006.01)
(52) U.S. Cl.
CPC ..................... *H03M 1/74* (2013.01)
(58) Field of Classification Search
CPC .......... H03M 1/66; H03M 1/74; H03M 1/745; H03M 1/742; H03M 1/068
See application file for complete search history.

(56) References Cited

U.S. PATENT DOCUMENTS

| | | | | |
|---|---|---|---|---|
| 6,593,868 B2 * | 7/2003 | Clara | ................ | H03M 1/0682 341/145 |
| 6,741,195 B1 * | 5/2004 | Cho | ................ | H03M 1/0872 341/135 |
| 6,967,609 B1 * | 11/2005 | Bicakci | ............ | H03K 17/04106 341/172 |
| 7,019,677 B1 * | 3/2006 | Soman | ................ | H03M 1/1061 341/144 |
| 7,023,367 B1 * | 4/2006 | Manganaro | ......... | H03M 1/0614 341/144 |

(Continued)

FOREIGN PATENT DOCUMENTS

JP     H09238078 A     9/1997

OTHER PUBLICATIONS

Extended European Search Report dated Jan. 5, 2024, issued in application No. EP 23183733.7.

(Continued)

*Primary Examiner* — Lam T Mai
(74) *Attorney, Agent, or Firm* — McClure, Qualey & Rodack, LLP (57) ABSTRACT

A complementary current-steering digital-to-analog converter (DAC) including a p-type DAC as well as an n-type DAC is shown. The p-type DAC has p-type current sources, and the n-type DAC has n-type current sources. The p-type and n-type current sources are coupled to a first input terminal or a second input terminal of a transimpedance amplifier (TIA) according to the digital input of the complementary current-steering DAC. In response to the digital input changing from a first value to a second value that is greater than the first value, one or more n-type current sources connected to the second input terminal of the TIA are switched so that they are connected to the first input terminal of the TIA.

16 Claims, 10 Drawing Sheets

(56) References Cited

U.S. PATENT DOCUMENTS

| | | | | |
|---|---|---|---|---|
| 7,388,531 B1* | 6/2008 | Cyrusian | H03M 1/0604 | 341/144 |
| 7,561,979 B2* | 7/2009 | Huang | H04N 17/00 | 702/107 |
| 7,576,675 B1* | 8/2009 | Lee | H03M 1/0818 | 341/150 |
| 8,009,074 B2* | 8/2011 | Lou | H03M 1/68 | 341/150 |
| 8,237,497 B2* | 8/2012 | Wen | H03F 3/45475 | 330/69 |
| 8,344,922 B2* | 1/2013 | Kier | H03M 1/068 | 341/150 |
| 8,451,150 B2* | 5/2013 | Chou | H03M 3/398 | 341/155 |
| 8,525,586 B2* | 9/2013 | Chen | H03G 1/04 | 330/254 |
| 8,653,999 B1* | 2/2014 | Verlinden | H03M 1/662 | 341/150 |
| 9,065,463 B2* | 6/2015 | Rajasekhar | H03M 1/0678 | |
| 9,112,528 B1* | 8/2015 | Currivan | H03M 1/002 | |
| 9,130,587 B2* | 9/2015 | Gomez | H03M 1/662 | |
| 9,509,326 B1* | 11/2016 | Kauffman | H03M 1/1009 | |
| 9,991,900 B1* | 6/2018 | Kabir | H03M 1/0673 | |
| 10,069,505 B1* | 9/2018 | Poulton | H03M 1/0641 | |
| 10,425,099 B1* | 9/2019 | Aouini | H03M 3/50 | |
| 10,693,489 B2 | 6/2020 | Roh | | |
| 11,362,668 B1* | 6/2022 | Brugger | H03M 1/747 | |
| 11,711,090 B2* | 7/2023 | Singh | H03M 1/1047 | 341/118 |
| 2001/0026232 A1* | 10/2001 | Andersson | H03M 1/1057 | 341/118 |
| 2002/0044076 A1* | 4/2002 | Yao | H03K 17/162 | 341/144 |
| 2003/0112164 A1* | 6/2003 | Scanlan | H03M 1/0863 | 341/135 |
| 2008/0036634 A1* | 2/2008 | Marais | H03M 1/0604 | 341/144 |
| 2008/0136694 A1* | 6/2008 | Imai | H03M 1/0604 | 341/144 |
| 2008/0272949 A1* | 11/2008 | Ramadoss | H03M 1/0881 | 341/144 |
| 2009/0033531 A1* | 2/2009 | Confalonieri | H03M 1/0648 | 341/144 |
| 2009/0045993 A1* | 2/2009 | Tokumaru | H03M 1/002 | 341/144 |
| 2009/0184855 A1* | 7/2009 | Tokumaru | H03M 1/002 | 341/144 |
| 2009/0201186 A1* | 8/2009 | Huang | H03M 1/0602 | 341/144 |
| 2010/0253561 A1* | 10/2010 | Mishra | H03M 1/0663 | 341/144 |
| 2010/0289680 A1* | 11/2010 | Ho | H03M 1/1057 | 341/145 |
| 2011/0018753 A1* | 1/2011 | Lou | H03M 7/3033 | 341/144 |
| 2011/0221620 A1* | 9/2011 | Mahajan | H03K 17/063 | 341/150 |
| 2013/0241758 A1* | 9/2013 | Hezar | H03M 3/464 | 341/144 |
| 2014/0152480 A1* | 6/2014 | Nguyen | H03M 1/66 | 341/144 |
| 2014/0159932 A1* | 6/2014 | Chang | H03M 1/0827 | 341/144 |
| 2015/0048960 A1* | 2/2015 | Zhu | H03M 1/66 | 341/144 |
| 2015/0244384 A1* | 8/2015 | Teterwak | H03M 1/74 | 341/144 |
| 2015/0244390 A1* | 8/2015 | Teterwak | H03M 1/1061 | 341/144 |
| 2017/0063388 A1* | 3/2017 | Kauffman | H03M 1/1009 | |
| 2019/0123751 A1* | 4/2019 | Kauffman | H03M 1/0607 | |
| 2020/0099389 A1* | 3/2020 | Sung | H03M 1/785 | |
| 2021/0175895 A1* | 6/2021 | Melanson | H04R 3/00 | |

OTHER PUBLICATIONS

De Wit, P., et al.; "Complementary DAC topology for reduced output impedance dependency and improved dynamic performance;" Electronics Letters; vol. 48; No. 17; Aug. 2012 ; pp. 1.

* cited by examiner

COMPLEMENTARY CURRENT-STEERING DIGITAL-TO-ANALOG CONVERTER

CROSS REFERENCE TO RELATED APPLICATIONS

This application claims the benefit of U.S. Provisional Application No. 63/370,398, filed Aug. 4, 2022, the entirety of which is incorporated by reference herein.

BACKGROUND OF THE INVENTION

Field of the Invention

The present invention relates to digital-to-analog converters (DACs), and, in particular, to a current-steering DAC.

Description of the Related Art

Technological progress (e.g., from WiFi 5 to WiFi 8) makes Error vector magnitude (EVM) requirements to be increased and Radio frequency (RF) impediments to be more obvious, meaning that digital calibration is more necessary. There is a trade-off between the DAC set point and DAC noise.

A low-noise DAC with a small circuit size and high power performance is called for.

BRIEF SUMMARY OF THE INVENTION

A complementary current-steering digital-to-analog converter (DAC) is introduced.

A complementary current-steering DAC in accordance with an exemplary embodiment of the present invention includes a transimpedance amplifier (TIA), a p-type DAC, and an n-type DAC. The p-type DAC has a plurality of p-type current sources. The p-type current sources are coupled to a first input terminal or a second input terminal of the TIA according to the digital input of the complementary current-steering DAC. The n-type DAC has a plurality of n-type current sources. The n-type current sources are coupled to the first input terminal or the second input terminal of the TIA according to the digital input of the complementary current-steering DAC. In response to the digital input changing from a first value to a second value that is greater than the first value, one or more n-type current sources connected to the second input terminal of the TIA are switched so that they are connected to the first input terminal of the TIA.

In an exemplary embodiment, in response to the digital input changing from a third value to a fourth value that is greater than the third value, one or more p-type current sources connected to the first input terminal of the TIA are switched so that they are connected to the second input terminal of the TIA.

In an exemplary embodiment, in response to the digital input changing from a fifth value to a sixth value that is greater than the fifth value, one or more p-type current sources connected to the first input terminal of the TIA are switched so that they are connected to the second input terminal of the TIA, and one or more of the n-type current sources connected to the second input terminal of the TIA are switched so that they are connected to the first input terminal of the TIA.

In an exemplary embodiment, the digital input is N bits, wherein N is a number. The number of p-type current sources is $2^{(N-1)}-1$. The number of n-type current sources is $2^{(N-1)}$.

In an exemplary embodiment, in response to the digital input of 0, the $2^{(N-1)}-1$ p-type current sources are connected to the first input terminal of the TIA, and the $2^{(N-1)}$ n-type current sources are connected to the second input terminal of the TIA.

In an exemplary embodiment, in response to the digital input that is N bits of 1, the $2^{(N-1)}-1$ p-type current sources are connected to the second input terminal of the TIA, and the $2^{(N-1)}$ n-type current sources are connected to the first input terminal of the TIA.

In an exemplary embodiment, from 1 to $2^{(N-2)}$, the greater the digital input is, the more n-type current sources are connected to the first input terminal of the TIA, and the $2^{(N-1)}-1$ p-type current sources are kept connected to the first input terminal of the TIA.

In an exemplary embodiment, from $2^{(N-2)}+1$ to $2^{(N-2)}+2^{(N-1)}-1$, the greater the digital input is, the more p-type current sources are connected to the second input terminal of the TIA, and $2^{(N-2)}$ n-type current sources are kept connected to the first input terminal of the TIA.

In an exemplary embodiment, from $2^{(N-2)}+2^{(N-1)}$ to $2^N-1$, the greater the digital input is, the more n-type current sources are connected to the first input terminal of the TIA, and the $2^{(N-1)}-1$ p-type current sources are kept connected to the second input terminal of the TIA.

In an exemplary embodiment, the complementary current-steering DAC further has a binary weighted circuit coupled to the second input terminal of the TIA to provide a fixed current. In an exemplary embodiment, the p-type current sources each output the fixed current, and the n-type current sources each output the fixed current.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
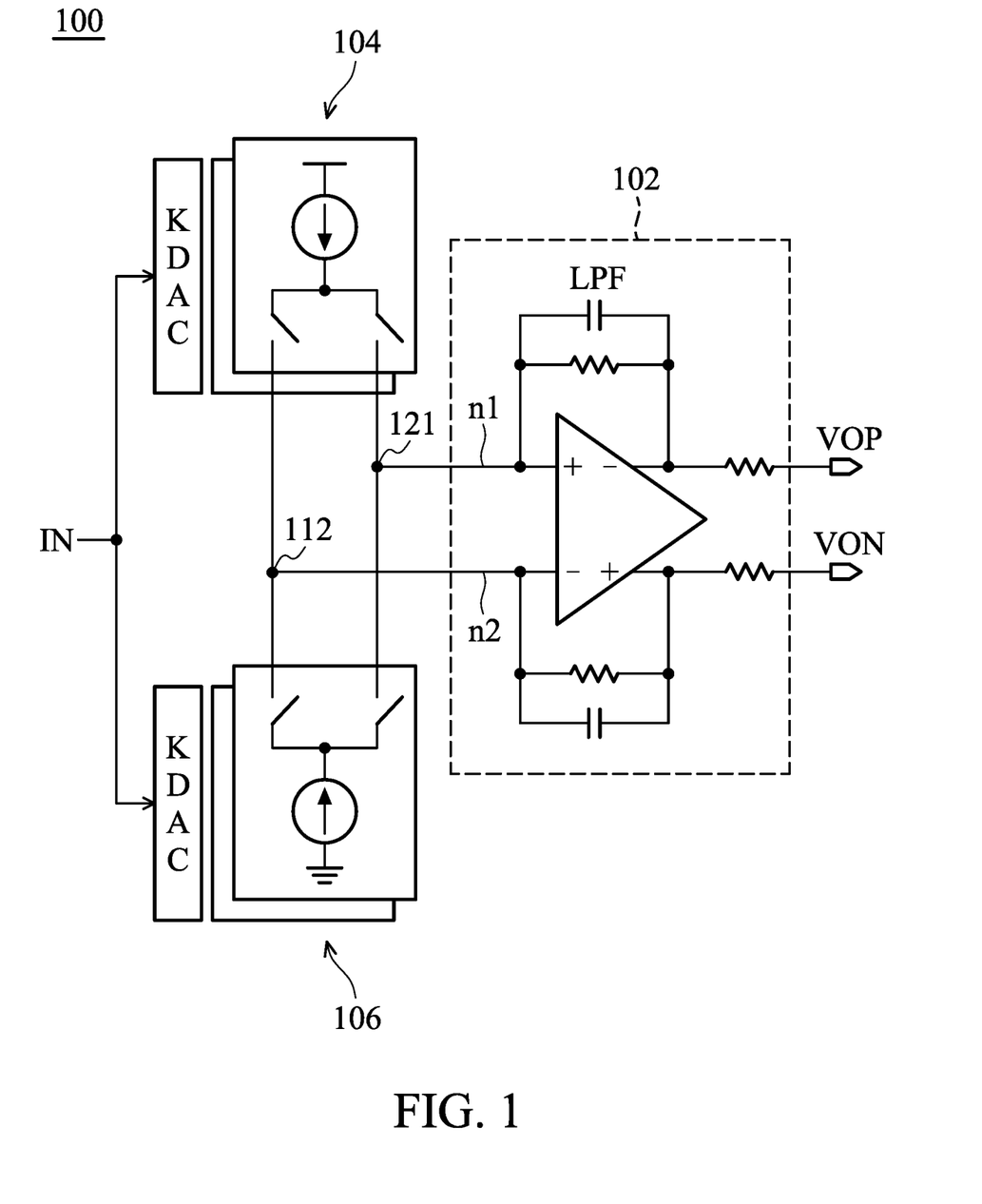
FIG. 1 illustrates a complementary current-steering digital-to-analog converter (DAC) 100 in accordance with an exemplary embodiment of the present invention.

FIG. 1 illustrates a complementary current-steering digital-to-analog converter (DAC) 100 in accordance with an exemplary embodiment of the present invention. The complementary current-steering DAC 100 has a transimpedance amplifier (abbreviated as TIA) 102, a p-type digital-to-analog converter (abbreviated as PDAC) 104, and an n-type digital-to-analog converter (abbreviated as NDAC) 106. The TIA 102 may be known as a low-pass filter.

The PDAC 104 has a plurality of p-type current sources (e.g., implemented by PMOSs). The p-type current sources are coupled to a first input terminal n1 or a second input terminal n2 of the TIA 102 according to the digital input IN of the complementary current-steering DAC 100.

The NDAC 106 has a plurality of n-type current sources (e.g., implemented by NMOSs). The n-type current sources are coupled to the first input terminal n1 or the second input terminal n2 of the TIA 102 according to the digital input IN of the complementary current-steering DAC 100.

After the current-steering digital-to-analog conversion, an analog output is represented by the difference between VOP and VON.

Different from a conventional current-steering DAC whose TIA has a first input terminal (n1) constantly connected to a n-type current source and a second input terminal (n2) constantly connected to another n-type current source, the NDAC 106 form the complementary current-steering structure with the PDAC 104. With the flexibility of the bias current, the fewer current sources are required and the circuit size is considerably reduced.

FIGS. 2A to 2H show how a 3-bit DAC 200 works in accordance with an exemplary embodiment of the present invention.

The 3-bit DAC 200 has three ($2^{(3-1)}-1$) p-type current sources Ip1, Ip2 and Ip3 in the PDAC 202, and has four ($2^{(3-1)}$) n-type current sources In1, In2, In3, and In4 in the NDAC 204. Switches are provided within the PDAC 202 and NDAC 204 to determine how to connect the p-type current sources Ip1~Ip3 and the n-type current sources In1~In4 to the first input terminal n1 or the second input terminal n2 of the TIA 206 according to the digital input IN of the 3-bit DAC 200. By controlling the PDAC 202 and NDAC 204 to change the bias current according to the digital input IN, an analog signal depending on the digital input IN is generated as the voltage difference at the output port of the TIA 206. The 3-bit DAC 200 further has a binary weighted circuit 208, which has a first output terminal t1 coupled to the second input terminal n2 of the TIA 206, and a second output terminal t2 coupled to the first input terminal n1 of the TIA 206. The binary weighted circuit 208 uses the first output terminal t1 to output a fixed current (64×, multiple of a base current 1×). Furthermore, the p-type current sources each output the fixed current (64×), and the n-type current sources each output the fixed current (64×).

Figure 2A:
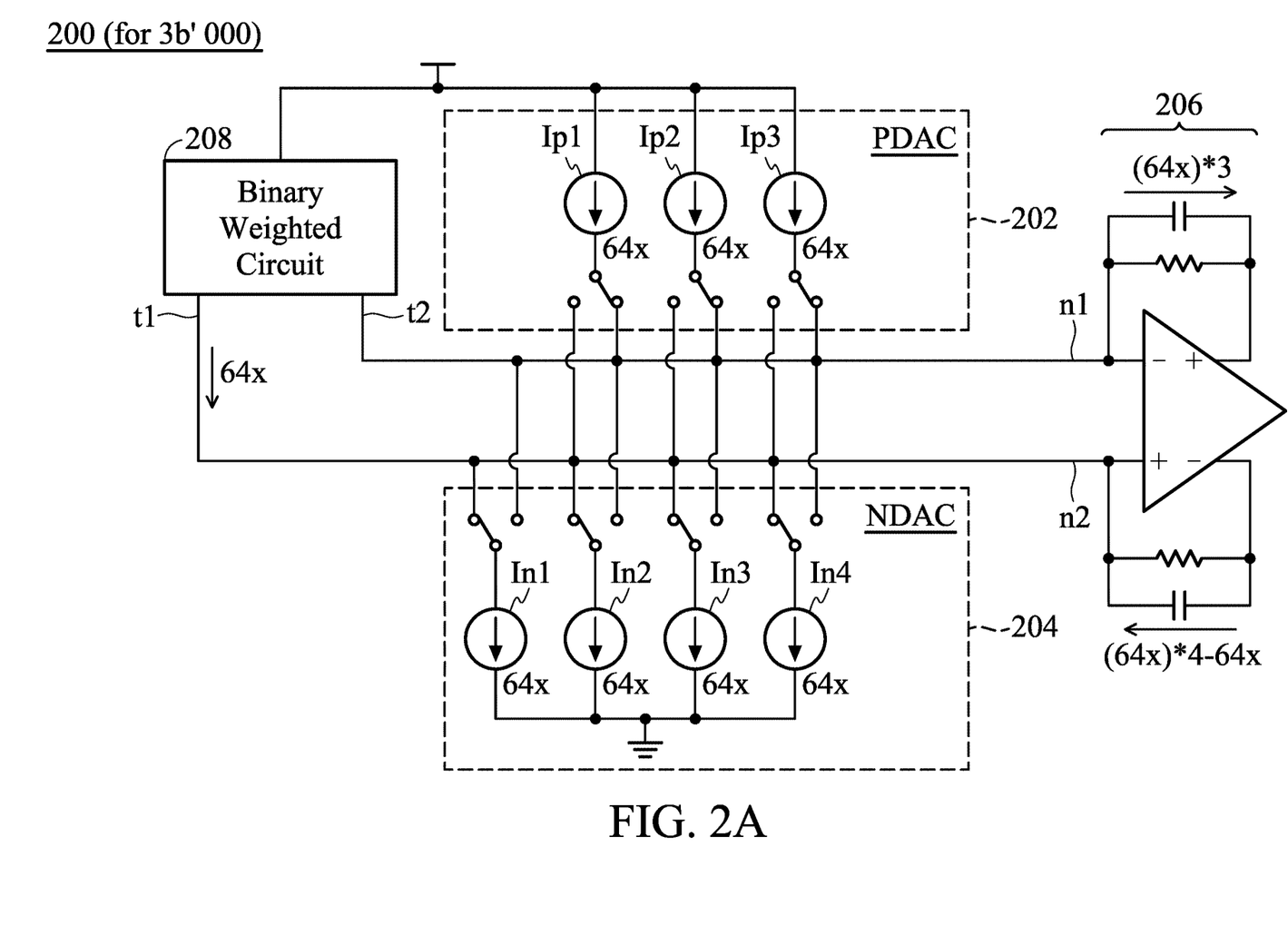
FIGS. 2A to 2H show how a 3-bit DAC 200 works in accordance with an exemplary embodiment of the present invention.

In FIG. 2A, the digital input IN is 3b' 000. The p-type current sources Ip1~Ip3 are all connected to the first input terminal n1 of the TIA 206, and the n-type current sources In1~In4 are all connected to the second input terminal n2 of the TIA 206. The current from the first node n1 to the output port of the TIA 206 is (64×)*3. The current from the output port of the TIA 206 to the second node n2 is (64×)*4−64×.

Figure 2B:
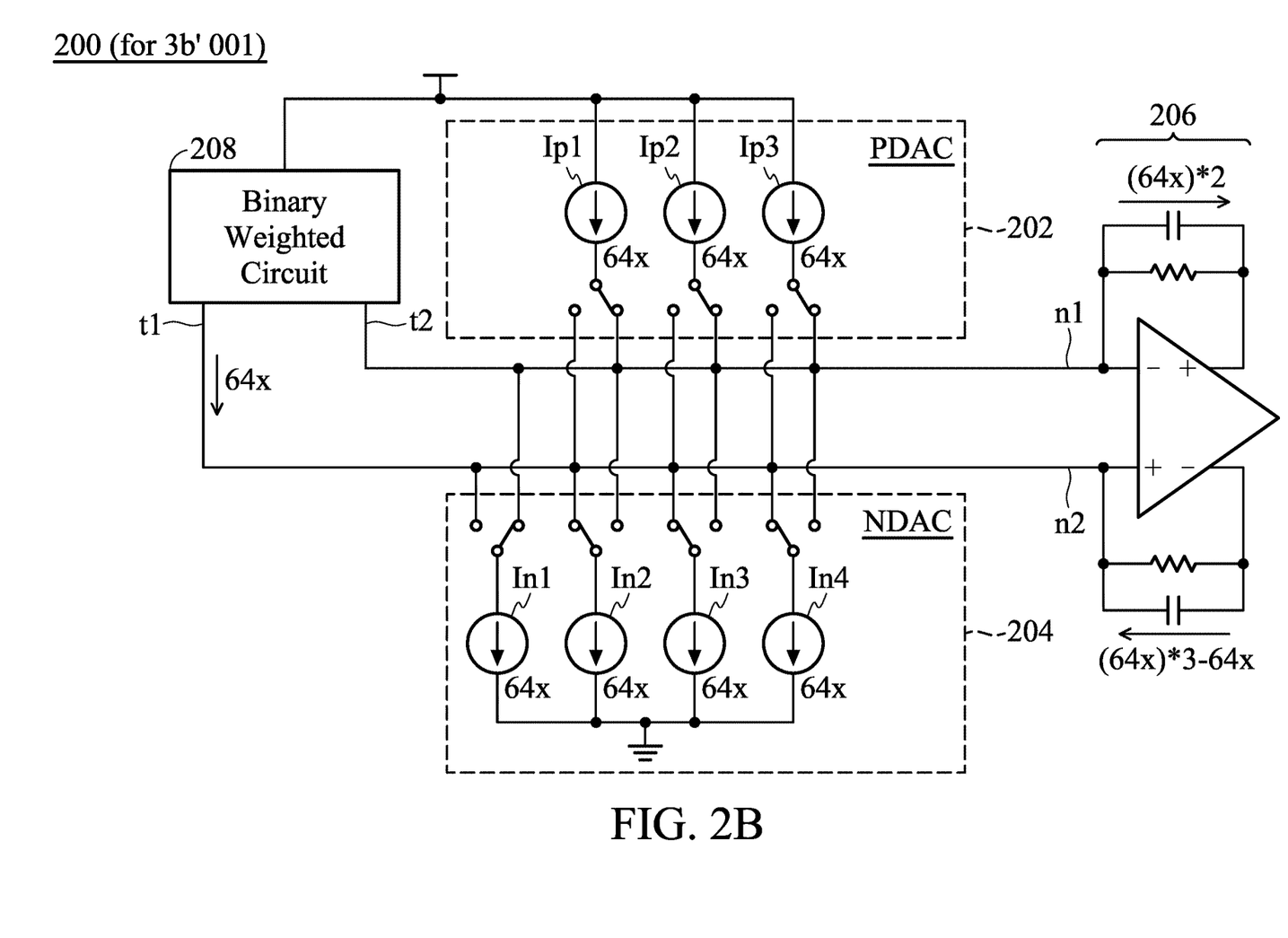

In FIG. 2B, the digital input IN is 3b' 001. The p-type current sources Ip1~Ip3 are all connected to the first input terminal n1 of the TIA 206, the n-type current source In1 is connected to the first input terminal n1 of the TIA 206, and the n-type current sources In2~In4 are connected to the second input terminal n2 of the TIA 206. The current from the first node n1 to the output port of the TIA 206 is (64×)*2. The current from the output port of the TIA 206 to the second node n2 is (64×)*3−64×.

Figure 2C:
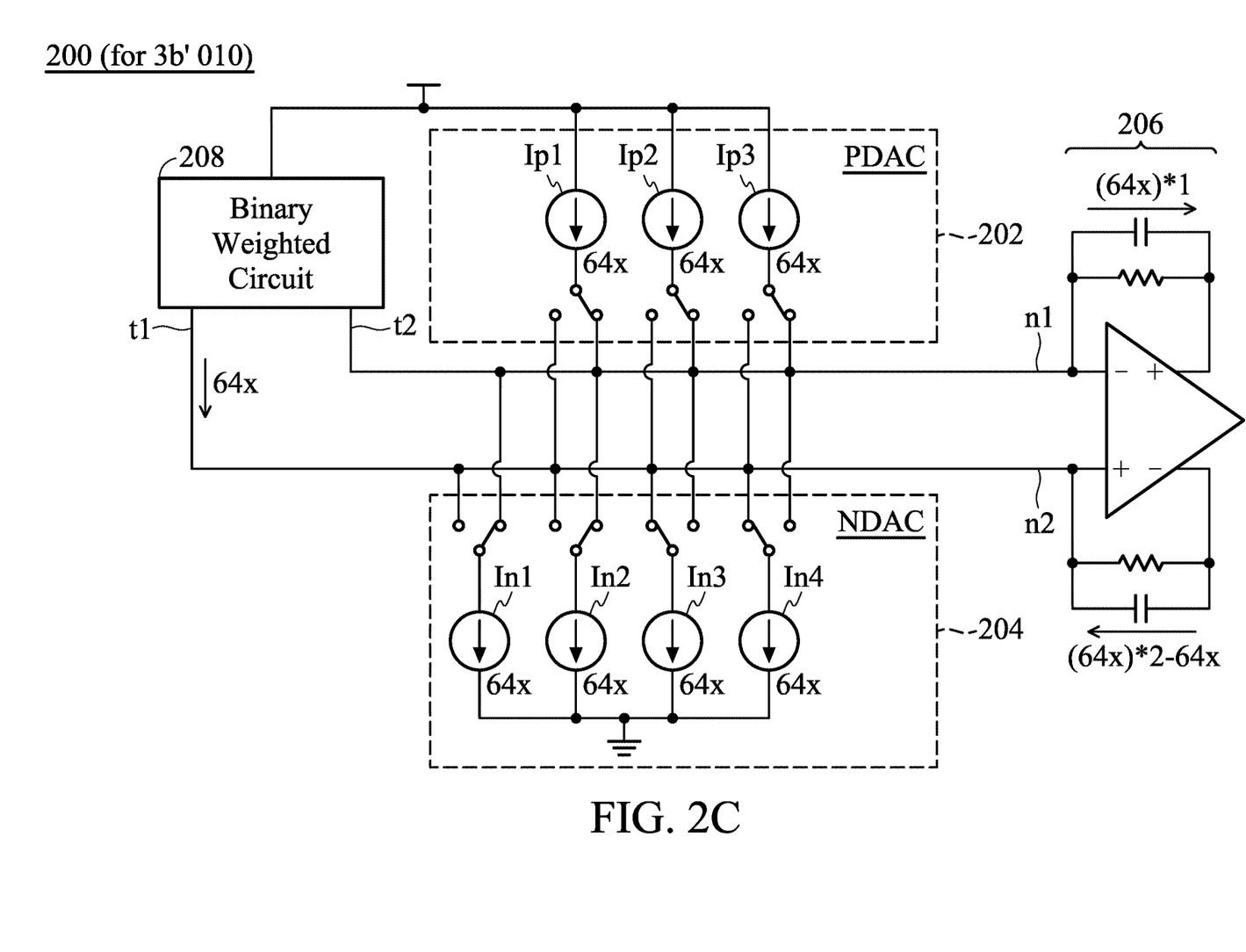

In FIG. 2C, the digital input IN is 3b' 010. The p-type current sources Ip1~Ip3 are all connected to the first input terminal n1 of the TIA 206, the n-type current sources In1 and In2 are connected to the first input terminal n1 of the TIA 206, and the n-type current sources In3 and In4 are connected to the second input terminal n2 of the TIA 206. The current from the first node n1 to the output port of the TIA 206 is (64×)*1. The current from the output port of the TIA 206 to the second node n2 is (64×)*2−64×.

Figure 2D:
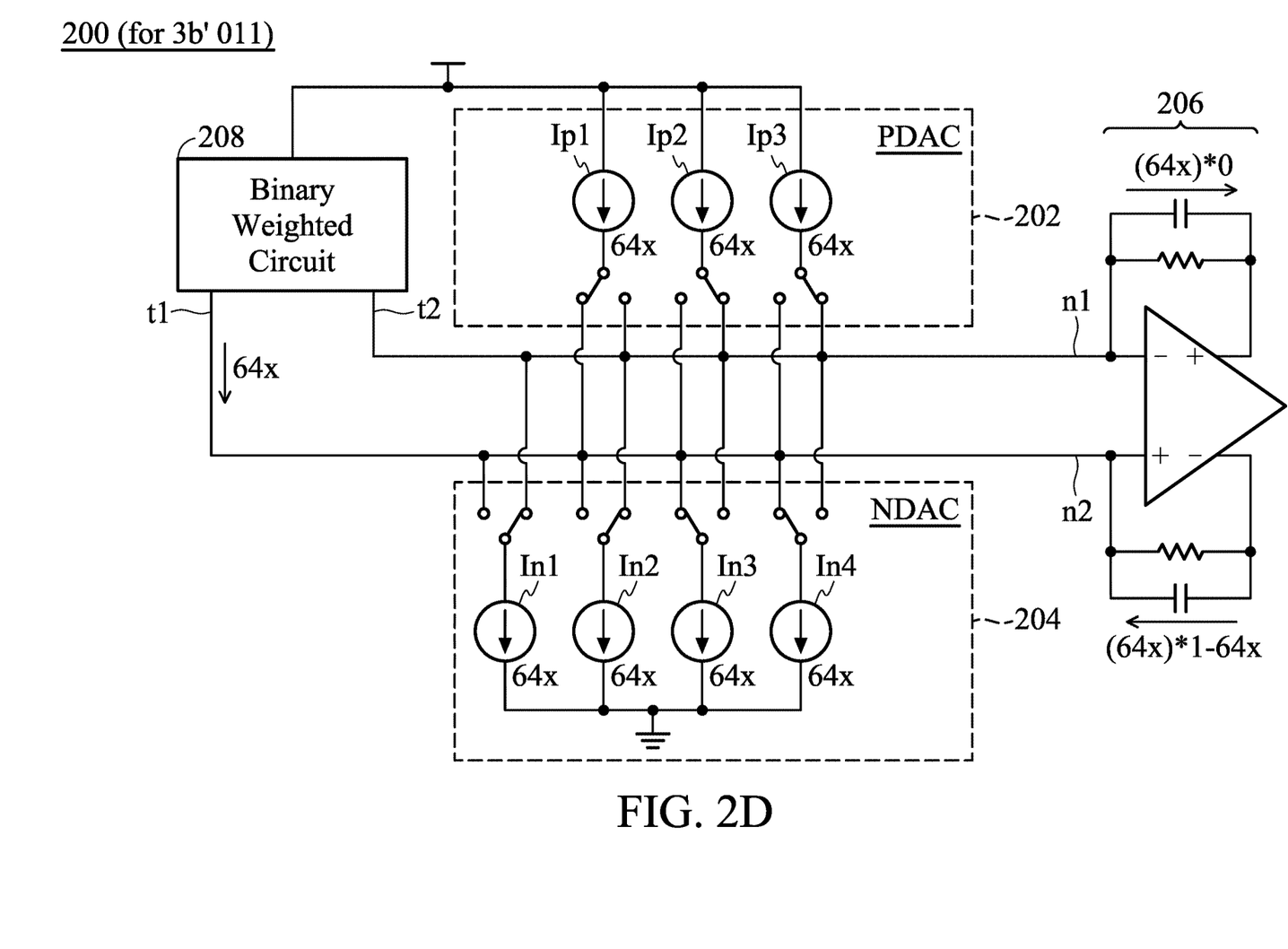

In FIG. 2D, the digital input IN is 3b' 011. The p-type current source Ip1 is connected to the second input terminal n2 of the TIA 206, the p-type current sources Ip2 and Ip3 are connected to the first input terminal n1 of the TIA 206, the n-type current sources In1 and In2 are connected to the first input terminal n1 of the TIA 206, and the n-type current sources In3 and In4 are connected to the second input terminal n2 of the TIA 206. The current from the first node n1 to the output port of the TIA 206 is (64×)*0. The current from the output port of the TIA 206 to the second node n2 is (64×)*1−64×.

Figure 2E:
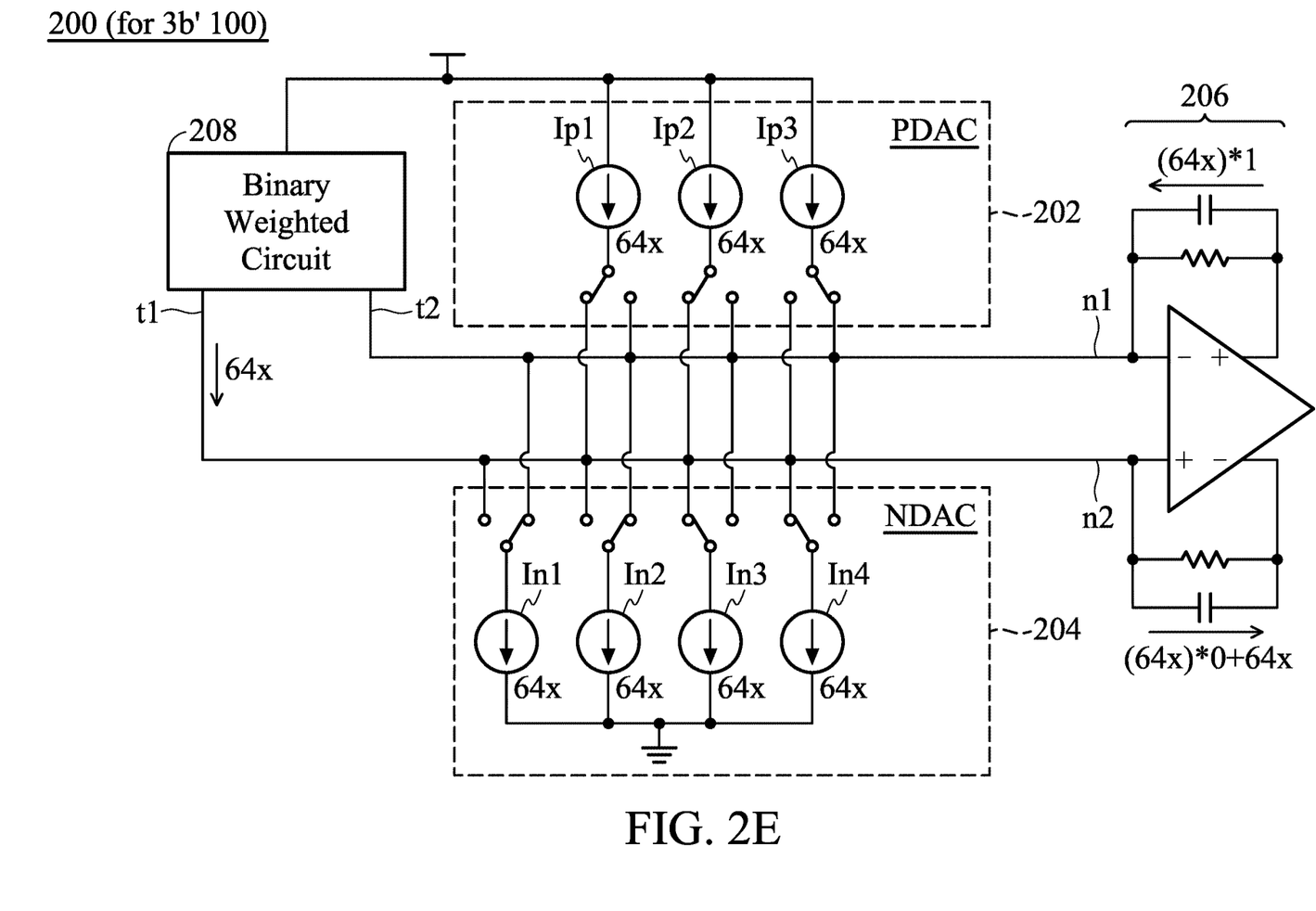

In FIG. 2E, the digital input IN is 3b' 100. The p-type current sources Ip1 and Ip2 are connected to the second input terminal n2 of the TIA 206, the p-type current source Ip3 is connected to the first input terminal n1 of the TIA 206, the n-type current sources In1 and In2 are connected to the first input terminal n1 of the TIA 206, and the n-type current sources In3 and In4 are connected to the second input terminal n2 of the TIA 206. The current direction is changed in comparison with FIGS. 2A-2D. The current from the output port of the TIA 206 to the first node n1 is (64×)*1. The current from the second node n2 to the output port of the TIA 206 to is (64×)*0+64×.

Figure 2F:
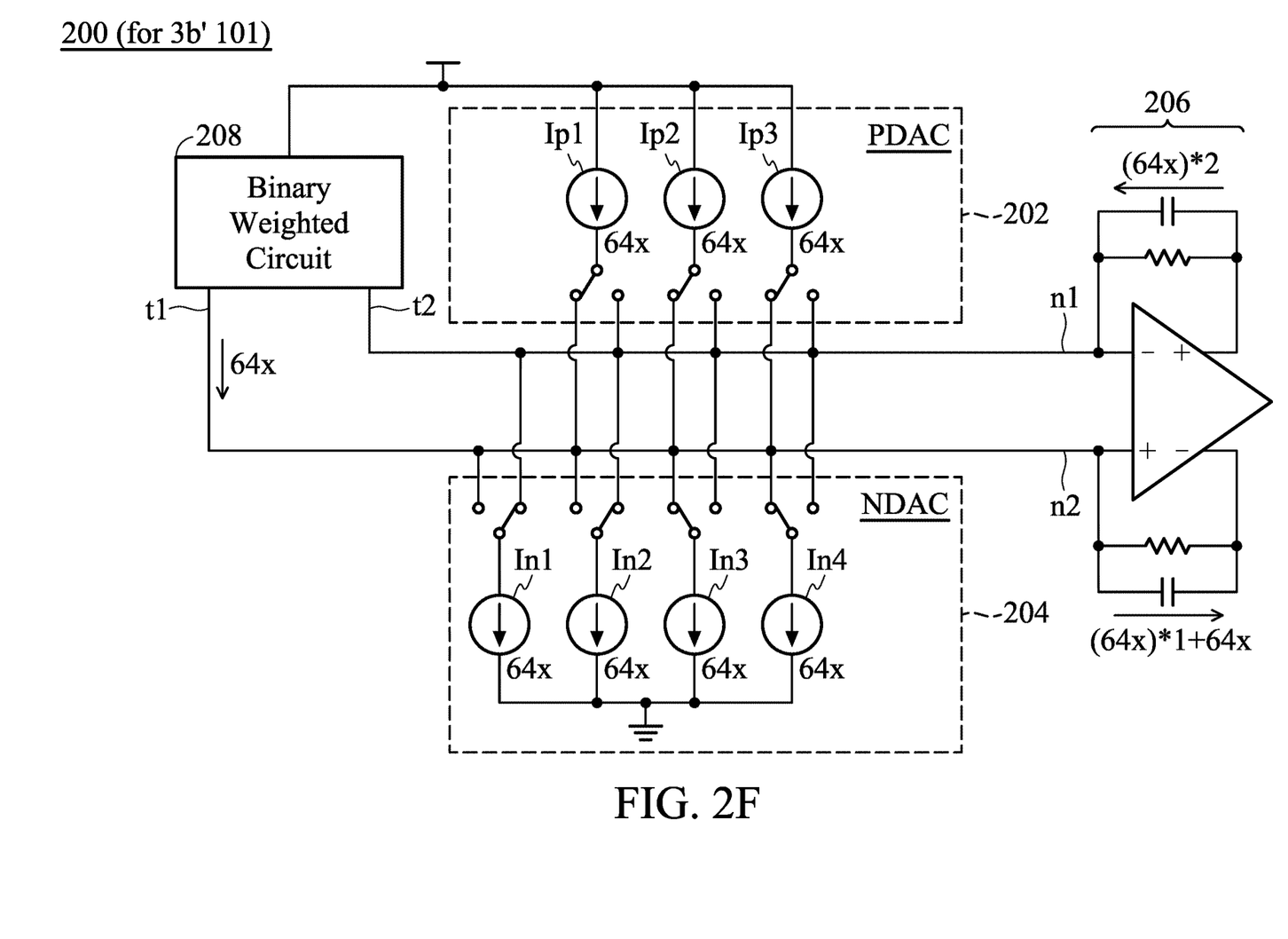

In FIG. 2F, the digital input IN is 3b' 101. The p-type current sources Ip1~Ip3 are all connected to the second input terminal n2 of the TIA 206, the n-type current sources In1 and In2 are connected to the first input terminal n1 of the TIA 206, and the n-type current sources In3 and In4 are connected to the second input terminal n2 of the TIA 206. The current from the output port of the TIA 206 to the first node n1 is (64×)*2. The current from the second node n2 to the output port of the TIA 206 to is (64×)*1+64×.

Figure 2G:
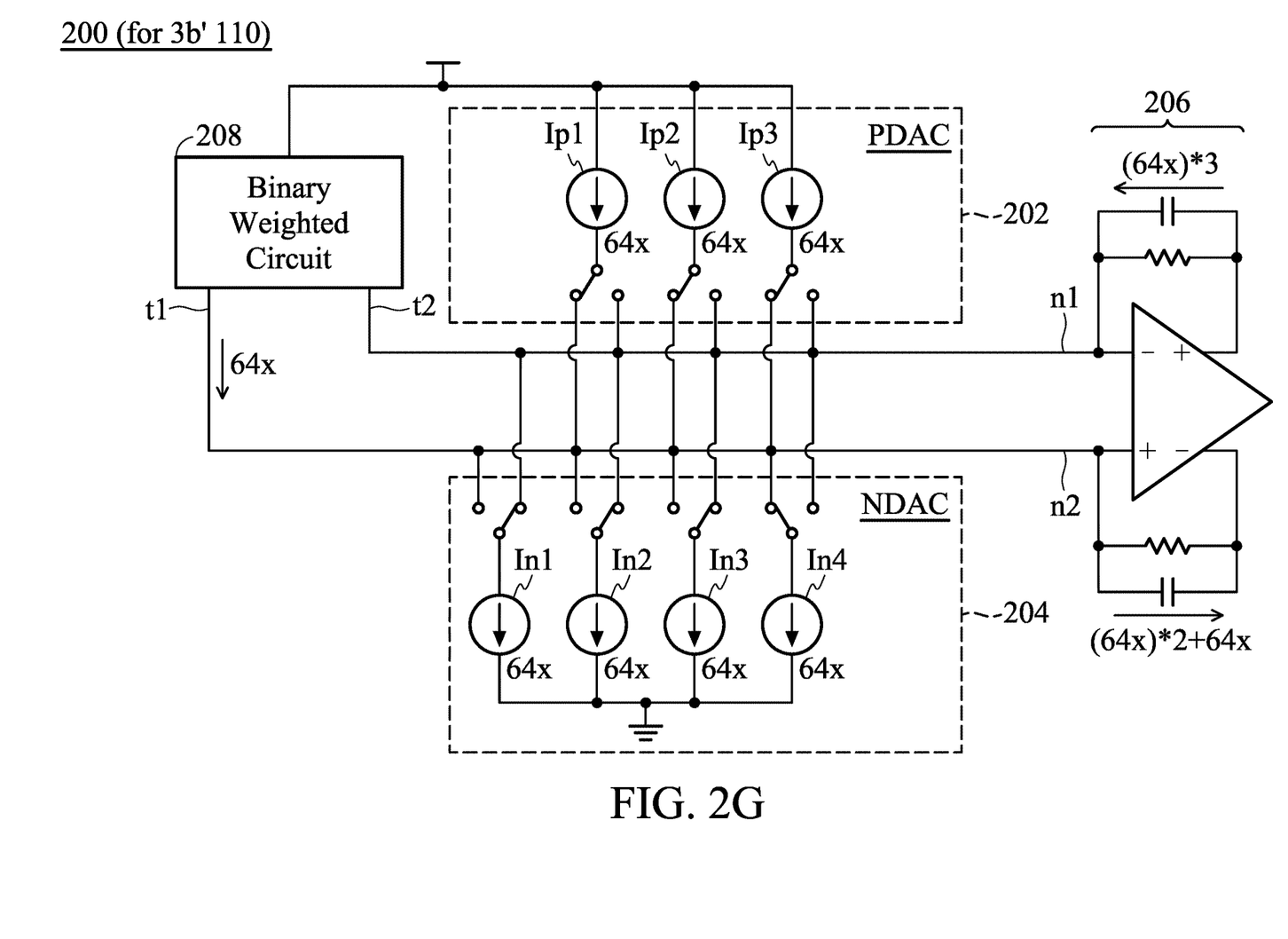

In FIG. 2G, the digital input IN is 3b' 110. The p-type current sources Ip1~Ip3 are all connected to the second input terminal n2 of the TIA 206, the n-type current sources In1~In3 are connected to the first input terminal n1 of the TIA 206, and the n-type current source In4 is connected to the second input terminal n2 of the TIA 206. The current from the output port of the TIA 206 to the first node n1 is (64×)*3. The current from the second node n2 to the output port of the TIA 206 to is (64×)*2+64×.

Figure 2H:
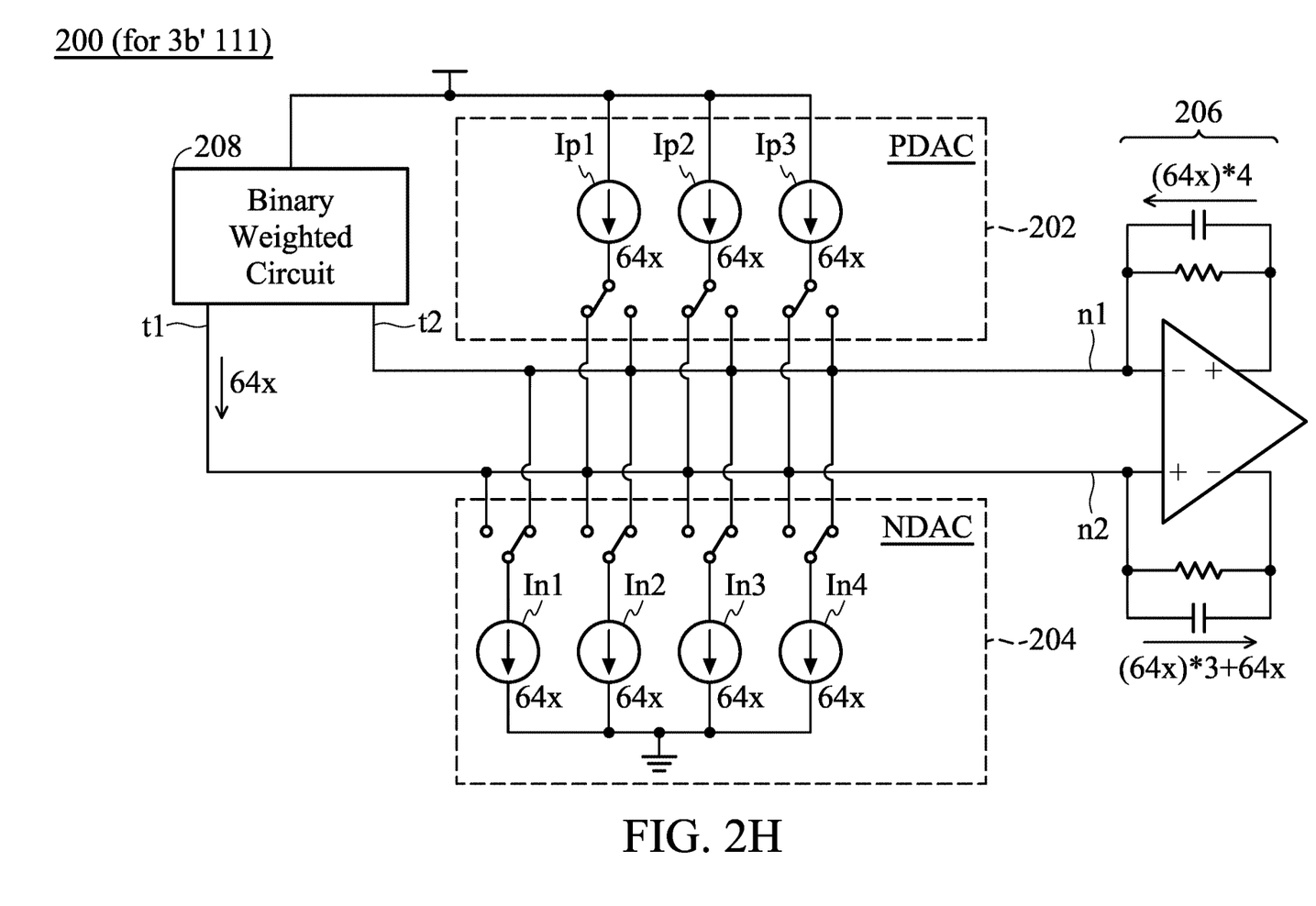

In FIG. 2H, the digital input IN is 3b' 111. The p-type current sources Ip1~Ip3 are all connected to the second input terminal n2 of the TIA 206, and the n-type current sources In1~In4 are all connected to the first input terminal n1 of the TIA 206. The current from the output port of the TIA 206 to the first node n1 is (64×)*4. The current from the second node n2 to the output port of the TIA 206 to is (64×)*3+64×.

The control principles of the p-type current sources Ip1~Ip3 and the n-type current sources In1~In4 can be summarized in the following.

Referring to FIGS. 2A-2C, in response to the digital input IN changing from a first value (3b' 000 of FIG. 2A) to a second value (3b' 001 of FIG. 2B, or 3b' 010 of FIG. 2C) that is greater than the first value (3b' 000), one or more n-type current sources connected to the second input terminal n2 of the TIA 206 are switched so that they are connected to the first input terminal n1 of the TIA 206. For example, when being changed from FIG. 2A to FIG. 2B, only the connection of In1 is changed. When being changed from FIG. 2A to FIG. 2C, both In1 and In2 are changed in their connections. The connection change from FIG. 2B to FIG. 2C, or from FIG. 2F to FIG. 2G, or from FIG. 2F to FIG. 2H, or from FIG. 2G to FIG. 2H follow the same principle. In these examples, the connection of the p-type current sources Ip1~Ip3 are kept.

Referring to FIGS. 2C-2F, in response to the digital input IN changing from a third value (3b' 010 of FIG. 2C) to a fourth value (3b' 011 of FIG. 2D, or 3b' 100 of FIG. 2E, or 3b' 101 of FIG. 2F) that is greater than the third value (3b' 010), one or more p-type current sources connected to the first input terminal n1 of the TIA 206 are switched so that they are connected to the second input terminal n2 of the TIA 206. For example, when being changed from FIG. 2C to FIG. 2D, only the connection of Ip1 is changed. When being changed from FIG. 2C to FIG. 2E, both Ip1 and Ip2 are changed in their connections. When being changed from FIG. 2C to FIG. 2F, Ip1~Ip3 are all changed in their connections. The connection change from FIG. 2D to FIG. 2E, or from FIG. 2D to FIG. 2F, or from FIG. 2E to FIG. 2F follow the same principle.

Referring to FIGS. 2A, 2G, and 2H, in response to the digital input IN changing from a fifth value (3b' 000 of FIG. 2A) to a sixth value (3b' 110 of FIG. 2G, or 3b' 111 of FIG. 2H) that is greater than the fifth value (3b' 000), one or more p-type current sources connected to the first input terminal n1 of the TIA 206 are switched so that they are connected to the second input terminal n2 of the TIA 206, and one or more of the n-type current sources connected to the second input terminal n2 of the TIA 206 are switched so that they are connected to the first input terminal n1 of the TIA 206. For example, when being changed from FIG. 2A to FIG. 2G, the connections of Ip1~Ip3 and In1~In3 are changed. When being changed from FIG. 2A to FIG. 2H, the connections of Ip1~Ip3 and In1~In4 are all changed.

In another perspective, the control principles of the p-type current sources Ip1~Ip3 and the n-type current sources In1~In4 are summarized in the following.

In response to the digital input IN changing from the second value (3b' 010 of FIG. 2C) to the seventh value (3b' 011 of FIG. 2D, or 3b' 100 of FIG. 2E, or 3b' 101 of FIG. 2F) that is greater than the second value (3b' 010), one or more of the p-type current sources connected to the first input terminal n1 of the TIA 206 are switched so that they are connected to the second input terminal n2 of the TIA 206, and the connection of the n-type current sources In1~In4 are kept.

In response to the digital input IN changing from the seventh value (3b' 011 of FIG. 2D) to an eighth value (3b' 100 of FIG. 2E, or 3b' 101 of FIG. 2F) that is greater than the seventh value 3b' 011, one or more of the p-type current sources connected to the first input terminal n1 of the TIA 206 are switched so that they are connected to the second input terminal n2 of the TIA 206, and the connection of the n-type current sources In1~In4 are kept.

In response to the digital input IN changing from the eighth value (3b' 101 of FIG. 2F) to a ninth value (3b' 110 of FIG. 2G, or 3b' 111 of FIG. 2H) that is greater than the eighth value (3b' 101), one or more of the n-type current sources connected to the second input terminal n2 of the TIA 206 are switched so that they are connected to the first input terminal n1 of the TIA 206, and the connection of the p-type current sources Ip1~Ip3 are kept.

In response to the digital input IN changing from the ninth value (3b' 110 of FIG. 2G) to a tenth value (3b' 111 of FIG. 2H) that is greater than the ninth value (3b' 110), one or more of the n-type current sources connected to the second input terminal n2 of the TIA 206 are switched so that they are connected to the first input terminal n1 of the TIA 206, and the connection of the p-type current sources Ip1~Ip3 are kept.

Figure 3:
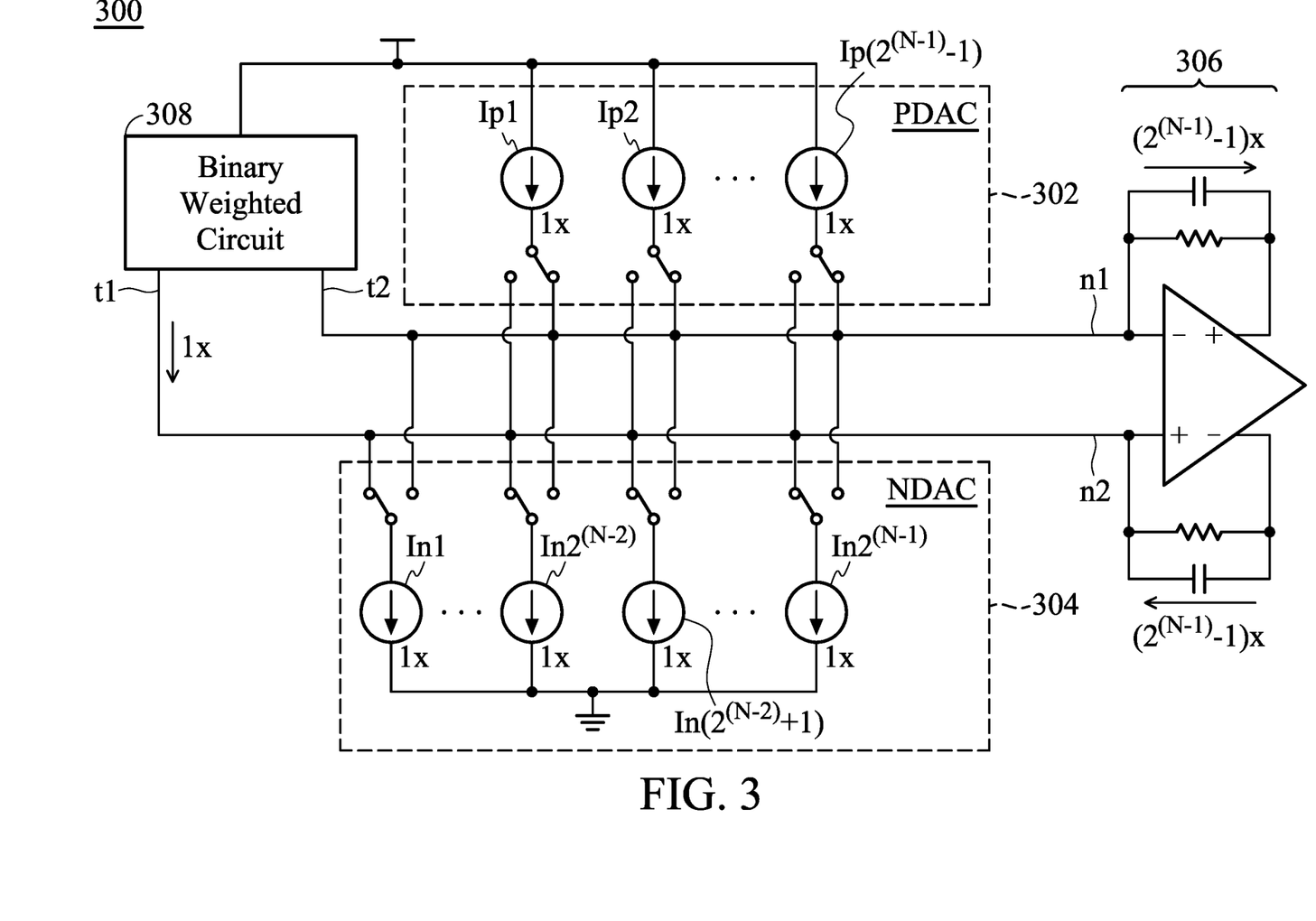
FIG. 3 shows an N-bit DAC 300 in accordance with an exemplary embodiment of the present invention.

FIG. 3 shows an N-bit DAC 300 in accordance with an exemplary embodiment of the present invention, which has a PDAC 302, an NDAC 304, a TIA 306, and a binary weighted circuit 308. In the PDAC 302, the number of p-type current sources is $2^{(N-1)}-1$ (referring to Ip1~Ip($2^{(N-1)}-1$)). In the NDAC 304, the number of n-type current sources is $2^{(N-1)}$ (referring to In1~In$2^{(N-1)}$). The fixed current is 1×.

In response to the digital input IN of 0, the $2^{(N-1)}-1$ p-type Current sources Ip1~Ip($2^{(N-1)}-1$) are all connected to the first input terminal n1 of the TIA 306, and the $2^{(N-1)}$ n-type current sources In1~In$2^{(N-1)}$ are all connected to the second input terminal n2 of the TIA 306. The current from the first node n1 to the output port of the TIA 306 is $(2^{(N-1)}-1)*1×$. The current from the output port of the TIA 306 to the second node n2 is $(2^{(N-1)}-1)*1×$.

In response to the digital input IN that is N bits of 1, the $2^{(N-1)}-1$ p-type Current sources Ip1~Ip($2^{(N-1)}-1$) are all connected to the second input terminal n2 of the TIA 306, and the $2^{(N-1)}$ n-type current sources In1~In$2^{(N-1)}$ are all connected to the first input terminal n1 of the TIA 306.

From 1 to $2^{(N-2)}$, the greater the digital input IN is, the more n-type current sources are connected to the first input terminal n1 of the TIA 306, and the $2^{(N-1)}-1$ p-type current sources Ip1~Ip($2^{(N-1)}-1$) are kept connected to the first input terminal n1 of the TIA 306.

From $2^{(N-2)}+1$ to $2^{(N-2)}+2^{(N-1)}-1$, the greater the digital input IN is, the more p-type current sources are connected to the second input terminal n2 of the TIA 306, and the $2^{(N-2)}$ n-type current sources In1~In$2^{(N-2)}$ are kept connected to the first input terminal n1 of the TIA 306.

From $2^{(N-2)}+2^{(N-1)}$ to $2^{N-1}$ the greater the digital input IN is, the more n-type current sources are connected to the first input terminal n1 of the TIA 306, and the $2^{(N-1)}-1$ p-type current sources Ip1~Ip($2^{(N-1)}-1$) are kept connected to the second input terminal n2 of the TIA 306.

Any current-steering DAC with the aforementioned complementary bias design (PDAC and NDAC) should be considered within the scope of the present invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A complementary current-steering digital-to-analog converter, comprising:
   a transimpedance amplifier;
   a p-type digital-to-analog converter, comprising a plurality of p-type current sources, wherein the p-type current sources are coupled to a first input terminal or a second input terminal of the transimpedance amplifier according to a digital input of the complementary current-steering digital-to-analog converter; and
   an n-type digital-to-analog converter, comprising a plurality of n-type current sources, wherein the n-type current sources are coupled to the first input terminal or the second input terminal of the transimpedance amplifier according to the digital input of the complementary current-steering digital-to-analog converter;
   wherein:
   in response to the digital input changing from a first value to a second value that is greater than the first value, one or more n-type current sources connected to the second input terminal of the transimpedance amplifier are switched so that they are connected to the first input terminal of the transimpedance amplifier.

2. The complementary current-steering digital-to-analog converter as claimed in claim 1, wherein:
in response to the digital input changing from a third value to a fourth value that is greater than the third value, one or more p-type current sources connected to the first input terminal of the transimpedance amplifier are switched so that they are connected to the second input terminal of the transimpedance amplifier.

3. The complementary current-steering digital-to-analog converter as claimed in claim 1, wherein:
in response to the digital input changing from a fifth value to a sixth value that is greater than the fifth value, one or more p-type current sources connected to the first input terminal of the transimpedance amplifier are switched so that they are connected to the second input terminal of the transimpedance amplifier, and one or more n-type current sources connected to the second input terminal of the transimpedance amplifier are switched so that they are connected to the first input terminal of the transimpedance amplifier.

4. The complementary current-steering digital-to-analog converter as claimed in claim 1, wherein:
in response to the digital input changing from the first value to the second value, the connection of the p-type current sources are kept.

5. The complementary current-steering digital-to-analog converter as claimed in claim 4, wherein:
in response to the digital input changing from the second value to a seventh value that is greater than the second value, one or more p-type current sources connected to the first input terminal of the transimpedance amplifier are switched so that they are connected to the second input terminal of the transimpedance amplifier, and the connection of the n-type current sources are kept.

6. The complementary current-steering digital-to-analog converter as claimed in claim 5, wherein:
in response to the digital input changing from the seventh value to an eighth value that is greater than the seventh value, one or more of the p-type current sources connected to the first input terminal of the transimpedance amplifier are switched so that they are connected to the second input terminal of the transimpedance amplifier, and the connection of the n-type current sources are kept.

7. The complementary current-steering digital-to-analog converter as claimed in claim 6, wherein:
in response to the digital input changing from the eighth value to a ninth value that is greater than the eighth value, one or more of the n-type current sources connected to the second input terminal of the transimpedance amplifier are switched so that they are connected to the first input terminal of the transimpedance amplifier, and the connection of the p-type current sources are kept.

8. The complementary current-steering digital-to-analog converter as claimed in claim 7, wherein:
in response to the digital input changing from the ninth value to a tenth value that is greater than the ninth value, one or more of the n-type current sources connected to the second input terminal of the transimpedance amplifier are switched so that they are connected to the first input terminal of the transimpedance amplifier, and the connection of the p-type current sources are kept.

9. The complementary current-steering digital-to-analog converter as claimed in claim 1, wherein:
the digital input is N bits, wherein N is a number;
the number of p-type current sources is $2^{(N-1)}$; and
the number of n-type current sources is $2^{(N-1)}$.

10. The complementary current-steering digital-to-analog converter as claimed in claim 9, wherein:
in response to the digital input of 0, the $2^{(N-1)}-1$ p-type Current sources are connected to the first input terminal of the transimpedance amplifier, and the $2^{(N-1)}$ n-type current sources are connected to the second input terminal of the transimpedance amplifier.

11. The complementary current-steering digital-to-analog converter as claimed in claim 10, wherein:
in response to the digital input that is N bits of 1, the $2^{(N-1)}-1$ p-type current sources are connected to the second input terminal of the transimpedance amplifier, and the $2^{(N-1)}$ n-type current sources are connected to the first input terminal of the transimpedance amplifier.

12. The complementary current-steering digital-to-analog converter as claimed in claim 11, wherein:
from 1 to $2^{(N-2)}$, the greater the digital input is, the more n-type current sources are connected to the first input terminal of the transimpedance amplifier, and the $2^{(N-1)}-1$ p-type current sources are kept connected to the first input terminal of the transimpedance amplifier.

13. The complementary current-steering digital-to-analog converter as claimed in claim 12, wherein:
from $2^{(N-2)}+1$ to $2^{(N-2)}+2^{(N-1)}-1$, the greater the digital input is, the more p-type current sources are connected to the second input terminal of the transimpedance amplifier, and $2^{(N-2)}$ n-type current sources are kept connected to the first input terminal of the transimpedance amplifier.

14. The complementary current-steering digital-to-analog converter as claimed in claim 13, wherein:
from $2^{(N-2)}+2^{(N-1)}$ to $2^N-1$, the greater the digital input is, the more n-type current sources are connected to the first input terminal of the transimpedance amplifier, and the $2^{(N-1)}-1$ p-type current sources are kept connected to the second input terminal of the transimpedance amplifier.

15. The complementary current-steering digital-to-analog converter as claimed in claim 1, further comprising:
a binary weighted circuit, having a first output terminal coupled to the second input terminal of the transimpedance amplifier, and a second output terminal coupled to the first input terminal of the transimpedance amplifier, wherein the binary weighted circuit uses the first output terminal to output a fixed current.

16. The complementary current-steering digital-to-analog converter as claimed in claim 15, further comprising:
the p-type current sources each output the fixed current; and
the n-type current sources each output the fixed current.

* * * * *

UNITED STATES PATENT AND TRADEMARK OFFICE
CERTIFICATE OF CORRECTION

PATENT NO. : 12,355,467 B2  
APPLICATION NO. : 18/325035  
DATED : July 8, 2025  
INVENTOR(S) : Chih-Hou Tsai et al.

Page 1 of 2

It is certified that error appears in the above-identified patent and that said Letters Patent is hereby corrected as shown below:

In the Drawings

Please replace Fig. 1 with Fig. 1 as shown on the attached page.

Signed and Sealed this  
Second Day of September, 2025

Coke Morgan Stewart  
*Acting Director of the United States Patent and Trademark Office*

FIG. 1